United States Patent
Elsayed et al.

(10) Patent No.: US 10,468,983 B2
(45) Date of Patent: Nov. 5, 2019

(54) SLEW-RATE CONTROLLED SUPPLY VOLTAGE SWITCHING

(71) Applicant: SILICON LABORATORIES INC., Austin, TX (US)

(72) Inventors: Mohamed Mostafa Elsayed, Austin, TX (US); Kenneth W. Fernald, Austin, TX (US); Matthew Powell, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 365 days.

(21) Appl. No.: 14/933,285

(22) Filed: Nov. 5, 2015

(65) Prior Publication Data

US 2017/0133931 A1    May 11, 2017

(51) Int. Cl.
*H02M 3/158* (2006.01)
*H03K 17/04* (2006.01)
*H02M 1/00* (2006.01)

(52) U.S. Cl.
CPC ............ *H02M 3/158* (2013.01); *H03K 17/04* (2013.01); *H02M 2001/0029* (2013.01)

(58) Field of Classification Search
CPC .................................................. H02M 3/158
See application file for complete search history.

(56) References Cited

U.S. PATENT DOCUMENTS

| | | | | | |
|---|---|---|---|---|---|
| 4,731,603 A | * | 3/1988 | McRae | ................ | G09B 21/009 340/407.1 |
| 5,528,172 A | * | 6/1996 | Sundstrom | ....... | H03K 19/01852 326/58 |
| 5,568,081 A | * | 10/1996 | Lui | .................. | H03K 19/00361 326/27 |
| 5,739,726 A | * | 4/1998 | Ling | .................... | H03K 3/0231 326/81 |
| 5,969,554 A | * | 10/1999 | Chan | ................ | H03K 19/00361 326/27 |
| 6,396,137 B1 | * | 5/2002 | Klughart | ................. | H01L 25/16 257/691 |
| 7,365,584 B2 | * | 4/2008 | Bennett | .............. | H03K 17/0822 327/110 |
| 7,548,117 B2 | * | 6/2009 | Zhang | ................. | H03F 3/45179 330/255 |
| 7,683,592 B2 | * | 3/2010 | Soude | ...................... | G05F 1/575 323/269 |
| 8,008,953 B1 | * | 8/2011 | Brumett, Jr. | ......... | H03K 17/166 327/109 |
| 8,362,805 B2 | * | 1/2013 | Suzuki | .............. | H03K 19/0016 326/21 |
| 8,446,109 B2 | * | 5/2013 | Yang | .................. | H05B 33/0824 315/291 |

(Continued)

*Primary Examiner* — Emily P Pham (57) ABSTRACT

An apparatus includes a slew rate regulation circuit, a plurality of switches and a controller circuit. The controller circuit controls the plurality of switches to decouple a first source supply voltage from a supply rail; control the plurality of switches to couple a second source supply voltage to the supply rail to replace the first source supply voltage with the second source supply voltage; and control the slew rate regulation circuit to regulate a slew rate of a voltage of the supply rail during a time interval in which the first source supply voltage is being replaced with the second source supply voltage.

18 Claims, 11 Drawing Sheets

(56) References Cited

U.S. PATENT DOCUMENTS

| | | | | |
|---|---|---|---|---|
| 8,487,689 B2* | 7/2013 | Floyd | ............... | H03K 17/08122 |
| | | | | 327/427 |
| 8,513,937 B2* | 8/2013 | DeBeer | ................ | H03K 17/164 |
| | | | | 323/283 |
| 9,196,207 B2* | 11/2015 | Lee | ....................... | G09G 3/3677 |
| 9,236,856 B2* | 1/2016 | Shi | ....................... | H03K 17/163 |
| 2006/0028274 A1* | 2/2006 | Ishii | .................... | H03F 3/45179 |
| | | | | 330/253 |
| 2006/0038615 A1* | 2/2006 | Regier | ................ | H03F 3/45744 |
| | | | | 330/259 |
| 2008/0061826 A1* | 3/2008 | De Araujo | .......... | H04L 25/0286 |
| | | | | 326/82 |
| 2011/0121900 A1* | 5/2011 | Muscha | ................... | H03K 5/08 |
| | | | | 330/254 |
| 2012/0056655 A1* | 3/2012 | Brauer | ................ | H03K 17/166 |
| | | | | 327/170 |
| 2012/0280965 A1* | 11/2012 | Lee | ....................... | G09G 3/3677 |
| | | | | 345/212 |
| 2013/0131771 A1* | 5/2013 | Lehmann | ........... | A61N 1/36125 |
| | | | | 607/137 |
| 2014/0253194 A1* | 9/2014 | Sadate | ............. | H03K 19/01852 |
| | | | | 327/170 |
| 2014/0354079 A1* | 12/2014 | Bailey | ....................... | G06F 1/26 |
| | | | | 307/116 |
| 2016/0124478 A1* | 5/2016 | Beeston | .................... | G06F 1/28 |
| | | | | 713/300 |

* cited by examiner

SLEW-RATE CONTROLLED SUPPLY VOLTAGE SWITCHING

BACKGROUND

A given electronic device, such as a smartphone or tablet, may receive power from one of multiple power sources. In this manner, the electronic device may receive power from a Universal Serial Bus (USB) interface, a battery, an AC power adapter and so forth. Moreover, the electronic device may contain circuitry to select, at a given time, the power source that is to provide power to the device.

SUMMARY

In accordance with an example implementation, a technique includes switching a supply rail from receiving a first voltage to receiving a second voltage; and regulating a slew rate associated with the switching.

In accordance with another example implementation, an apparatus includes a slew rate regulation circuit; a plurality of switches; and a controller circuit. The controller circuit controls the plurality of switches to decouple a first source supply voltage from a supply rail; controls the plurality of switches to couple a second source supply voltage to the supply rail to replace the first source supply voltage with the second source supply voltage; and controls the slew rate regulation circuit to regulate a slew rate of a voltage of the supply rail during a time interval in which the first source supply voltage is being replaced with the second source supply voltage.

In yet another example implementation, an apparatus includes an integrated circuit (IC), which includes a power consuming component; a supply rail coupled to the power consuming component to provide a supply voltage to the power consuming component; and a switch control circuit. The switch control circuit includes a plurality of switches; a slew rate regulator; and a controller circuit. The controller circuit controls the plurality of switches and the slew rate regulator to transition the supply rail from receiving a first supply voltage to receiving a second supply voltage; and the controller circuit regulates a slew rate of the supply voltage during the transition.

Advantages and other features will become apparent from the following drawings, description and claims.

DETAILED DESCRIPTION

An electronic system may have multiple potential sources for its power, such as a battery, an AC wall adapter, and so forth. The electronic system may contain circuitry to select one of the supply voltage sources and distribute power derived from the selected supply voltage to power consuming components of the system. During operation of the electronic system, one power source may be switched for another, and ideally, this transition occurs without interrupting the operations of components of the system.

For example, the electronic system may receive power from an external battery, and when the battery becomes discharged, the system may be switched to receive power from another power source, such as a backup battery or a DC-to-DC output source. This switching should occur without disturbing the operation of analog modules (modules containing phase locked loops (PLLs) for example) of the electronic system, which may be particularly sensitive to the switching. In this manner, a supply voltage glitch that occurs during the switching may disturb oscillators of the modules, which may lead to partial, if not full, resets of the modules. Moreover, a sudden change in the supply voltage provided to the analog modules during switching may disturb the operation of those modules.

One approach to suppress such supply voltage glitches or sudden changes involves using a capacitor to serve as a backup power source for analog modules during transitions between supply voltage sources. For example, an electronic system may include an integrated circuit (IC) that contains analog modules, and a relatively large capacitor may be disposed external to the IC, (i.e., disposed "off chip"). The power supply rail for the analog modules may be coupled to a power switch of the IC, which couples the modules to an external power source, such as a battery. When replacing the external power source of the IC, the switch may be turned off, and the off chip capacitor provides the supply voltage for the IC during the transition. After the external power source is replaced, the switch may be turned back on.

In accordance with example techniques and systems that are described herein, supply voltage glitches and sudden changes due to source switching are suppressed by controlling the slew rate of the switching to correspondingly control the slew rate of the supply rail voltage during its transition. A potential advantage of this approach is that an IC pin is not dedicated for purposes of coupling the IC's supply voltage rail to an off chip capacitor. Moreover, this approach allows the switching of a voltage supply source for analog modules between a higher voltage external power source, such as a battery, and a lower voltage power source, such as a DC-to-DC output, which reduces the energy consumption of the analog modules while delivering the same performance. Other and different advantages may be achieved with the techniques and systems that are described herein, in accordance with further example implementations.

Figure 1:
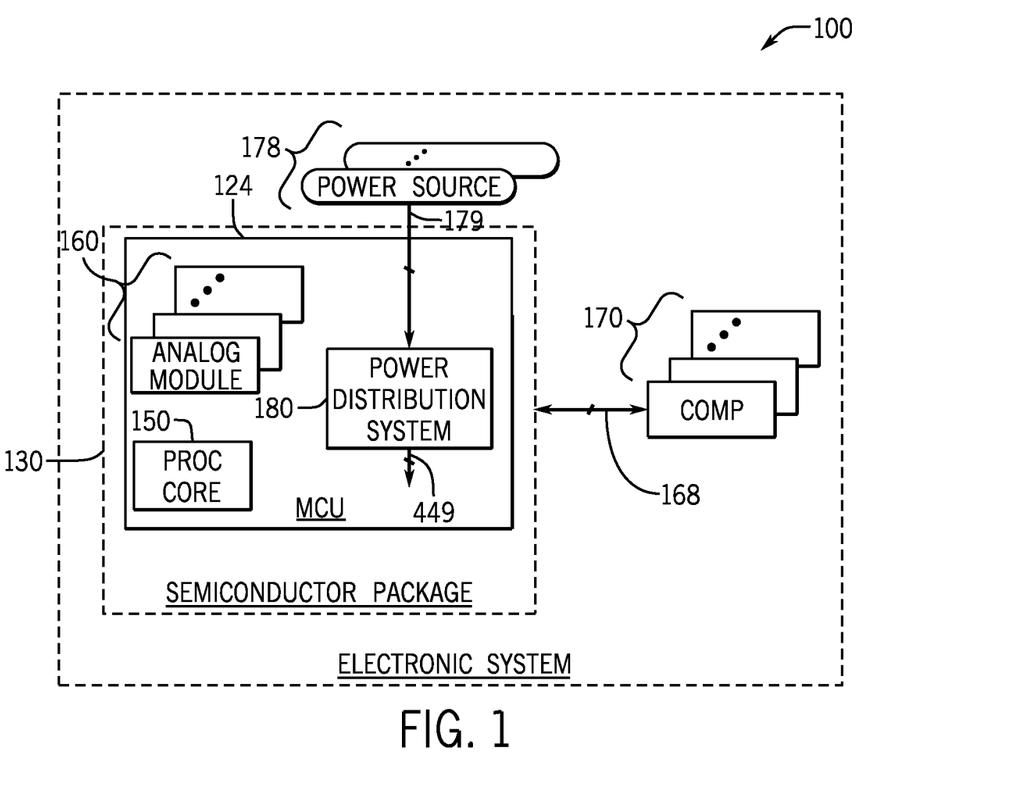
FIG. 1 is a schematic diagram of an electronic system according to an example embodiment.

FIG. 1 depicts an example embodiment of an electronic system 100 that contains a microcontroller unit (MCU) 124 and components 170 that are controlled by the MCU 124 via hardwired and/or wireless inputs/outputs (I/Os) 168 of the MCU 124. As examples, the component(s) 170 may include one or more of the following depending on the particular application: a lighting element (such as a light emitting diode (LED), for example); an electrical motor; a household appliance; an inventory control terminal; a computer; a tablet; a smart power meter; a wireless interface; a cellular interface; an interactive touch screen user interface; and so forth.

As depicted in FIG. 1, the MCU 124, in accordance with example embodiments, includes a power distribution system 180, which may receive multiple source supply voltages from potentially multiple power sources 178 (via inputs 179). As examples, the power sources 178 may be a battery, a Universal Serial Bus (USB) interface, an AC wall adapter, a wireless power transmitter, and so forth and may or may not be partially integrated into the MCU 124. The power distribution system 180, in accordance with example embodiments, contains switching circuitry to select and couple one or multiple of the source supply voltages to one or multiple of the power supply rails 449 of the MCU 124, which communicate power to various power consuming components of the MCU 124, such as DC-to-DC regulators, analog modules 160, digital components, and so forth. The power distribution system 180 also identifies a maximum source supply voltage among the received source supply voltages and couples the identified maximum voltage to the power supply rail(s) and isolation well(s) of its switching circuitry for purposes of limiting the static power consumption of the switching circuitry.

In accordance with example embodiments, all or part of the components of the MCU 124 may be part of a semiconductor package 130. More specifically, referring to FIG. 2 in conjunction with FIG. 1, in accordance with some embodiments, all or part of the components of the MCU 124 may be part of an integrated circuit (IC) 200. As examples, all or part of the components of the MCU 124 may be fabricated on a single die or on multiple dies. The IC 200 may be packaged to form the semiconductor package 130.

Figure 2:
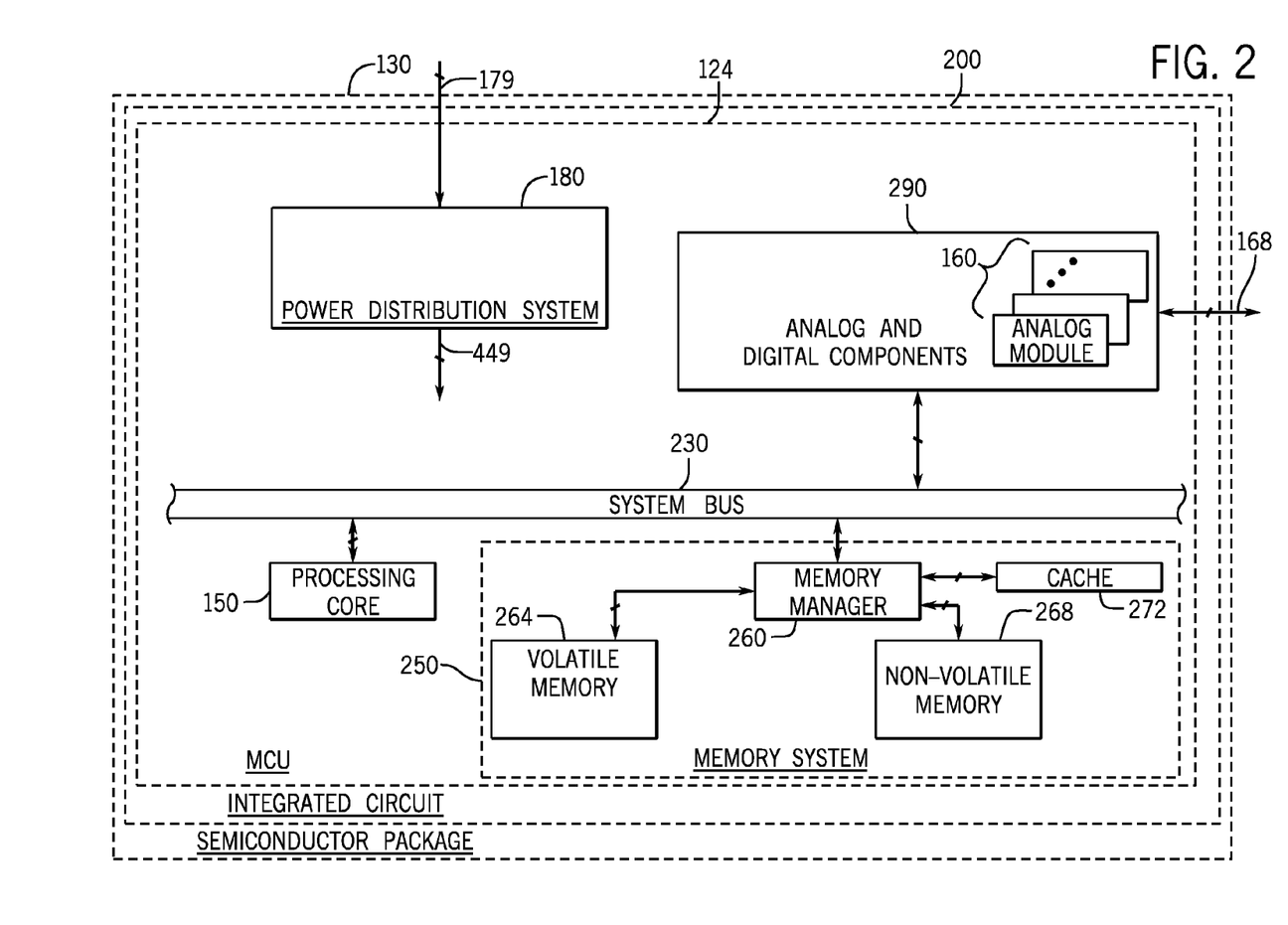
FIG. 2 is a schematic diagram of a microcontroller unit (MCU) of the electronic system of FIG. 1 according to an example embodiment.

Among its components, the MCU 124 includes one or multiple processing cores 150 and analog and digital peripheral components 290. The digital components may include peripheral components that communicate with the processing core 150 and a memory system 250 of the MCU 124 over a system bus 230, such as (as examples) direct memory access (DMA) engines, universal asynchronous receiver/transmitter (UART) devices, serial peripheral interface (SPI) devices, programmable timers, a packet radio, I/O buffers, a Universal Serial Bus (USB) interface, and so forth. The analog components include various analog modules 160 that receive analog signals, such as analog-to-digital converters (ADCs) and comparators. The MCU 124 may contain one or multiple analog modules 160 that provide analog signals, such as current drivers; and the MCU 124 may contain one or multiple analog modules 160 that contain an oscillator, such as a module 160 that contains a phase locked loop (PLL), for example.

As an example, the processing core 150 may be a 32-bit core, such as the Advanced RISC Machine (ARM) processing core, which executes a Reduced Instruction Set Computer (RISC) instruction set. In further example embodiments, the processing core 150 may be a less powerful core, such as an 8-bit core (an 8051 core, for example).

The memory system 250, in accordance with some embodiments, includes a memory manager 260 that controls access to various memory components of the MCU 124, such as a cache 272, a non-volatile memory 268 (a Flash memory, for example) and a volatile memory 264 (a static random access memory (SRAM), for example). In example embodiments, the volatile memory 264 and the non-volatile memory 268 have memory locations that are part of the system memory address space for the MCU 124.

It is noted that FIG. 2 depicts a simplified representation of the MCU architecture, as the MCU 124 may have many other components, bridges, buses, and so forth, in accordance with further embodiments, which are not depicted in FIG. 2. For example, in accordance with some embodiments, the MCU 124 may have a bus matrix module that implements slave side arbitration and is used to regulate access to the memory devices of the MCU 124.

Figure 3:
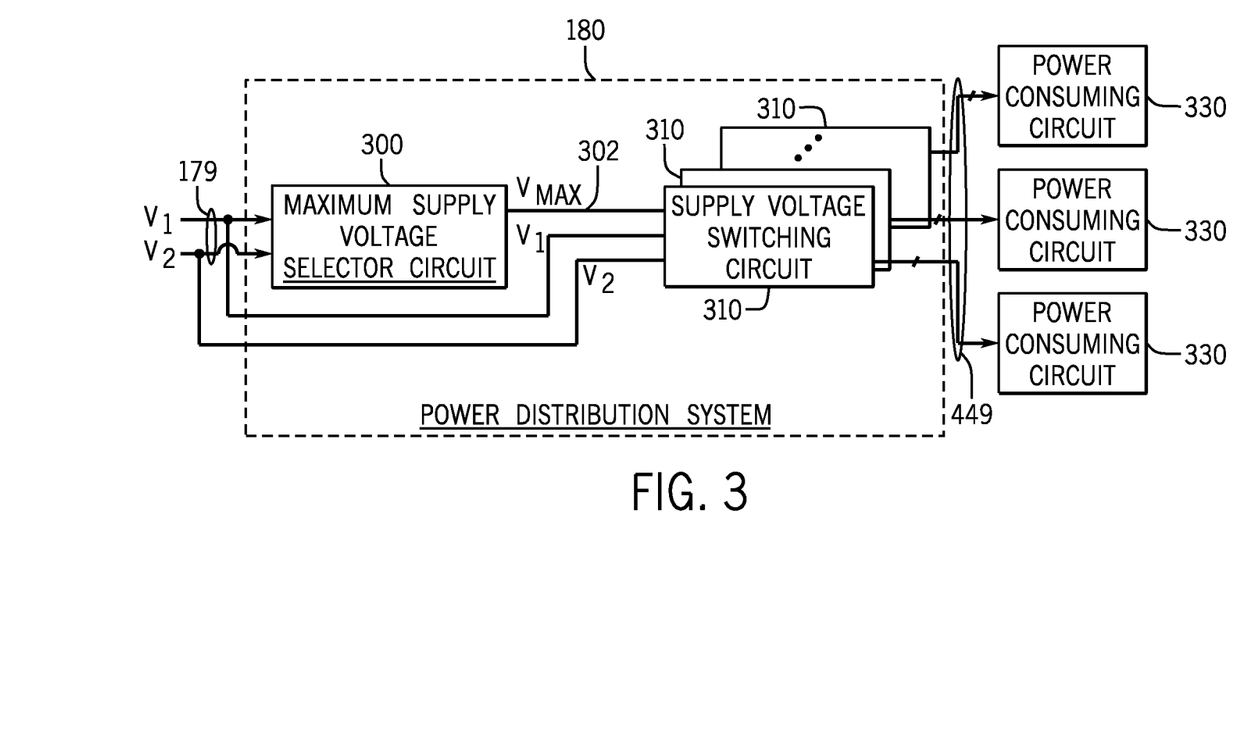
FIG. 3 is a schematic diagram of a power distribution system of the MCU according to an example embodiment.

FIG. 3 depicts the power distribution system 180 for an example embodiment in which the electronic system 100 receives two source supply voltages called "$V_1$" and "$V_2$." One or multiple supply switching circuits 310 of the power distribution system 180, in accordance with example embodiments, selectively route the $V_1$ and $V_2$ source supply voltages to associated power consuming circuits 330. In accordance with example embodiments, for purposes of minimizing the power consumed by the supply switching circuits 310, power supply rail and isolation well connections of the circuits 310 receive a maximum supply voltage (called "$V_{MAX}$" in FIG. 3).

The $V_{MAX}$ maximum supply voltage is the maximum supply voltage that is currently being received by the power distribution system 180, as identified by its maximum supply voltage selector circuit 300. In this manner, because the maximum source supply voltage that is received by the electronic system 100 may continually change, for example, as power sources 178 (FIG. 1) are connected to and disconnected from the electronic system 100, the maximum supply voltage selector circuit 300 monitors the received source supply voltages, identifies the current maximum magnitude source supply voltage and provides this voltage as the $V_{MAX}$ maximum supply voltage at its terminal 302. For the particular embodiment that is depicted in FIG. 3, the maximum supply voltage selector circuit 300 compares the $V_1$ and $V_2$ source supply voltages and couples either the $V_1$ source supply voltage or the $V_2$ source supply voltage to the terminal 302, depending on which source supply voltage is determined by the maximum supply voltage selector circuit 300 to have the largest magnitude.

Each supply voltage switching circuit 310 provides a supply voltage to an associated supply rail 449; and one or multiple power consuming circuits 330 are coupled to each of the supply rails 449. In accordance with example embodiments, each supply voltage switching circuit 310 connects one of the supply voltage sources to the associated supply rail 449. During the course of operation of the electronic system 100, the supply voltage switching circuit 310 may be instructed (via communication with a processing core 150, for example) to switch between its source supply voltages so that the circuit 310 switches the supply rail 449 from receiving a supply voltage from a first supply voltage source to receiving a supply voltage from another supply voltage source. In accordance with example embodiments that are described herein, the supply voltage switching circuit 310 regulates the slew rate of the voltage of the supply rail 449 during this transition for purposes of inhibiting, if not preventing, glitches in the voltage and sudden supply changes.

Figure 4:
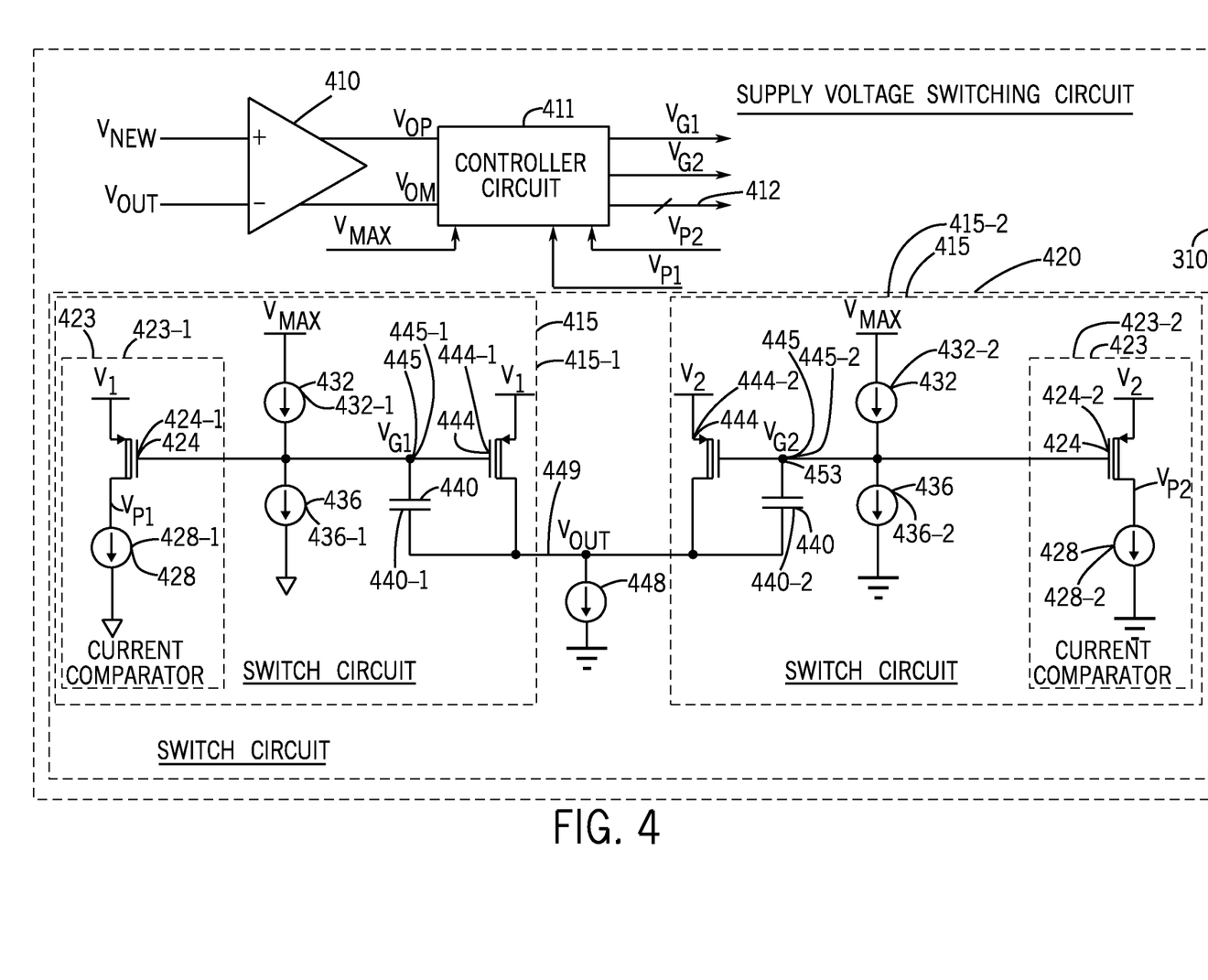
FIG. 4 is a schematic diagram of a supply voltage switching circuit of the MCU according to an example embodiment.

Referring to FIG. 4, more specifically, in accordance with example embodiments, the supply voltage switching circuit 310 includes switch circuits 415 (two example switch circuits 415-1 and 415-2 being depicted in FIG. 4). Each switch circuit 415 is associated with a particular source supply voltage and controls the coupling/decoupling of the voltage to/from the supply voltage rail 449 of the supply voltage switching circuit 310. In this manner, during a steady state of operation for the supply voltage switching circuit 310 in which no switching transition occurs, one of the switch circuits 415 couples one of the source supply voltages to the supply rail 449 so that the voltage (called the "$V_{OUT}$" voltage herein) of the rail 449 is this source supply voltage; and the other switch circuit(s) 415 isolate the other source supply voltage(s) from the supply rail 449. As depicted in FIG. 4, the supply rail 449 provides the $V_{OUT}$ voltage to a load (i.e., the load of the associated power consuming circuit 330) and is represented in FIG. 4 by a current sink 448 that is coupled to the supply rail 449.

For the example embodiment of FIG. 4, the supply voltage switching circuit 310 contains two switch circuits 415-1 and 415-2, which control the coupling/decoupling of the $V_1$ source supply voltage to/from the supply rail 449 (for the switch circuit 415-1) and the coupling/decoupling of the $V_2$ source supply voltage to/from the supply rail 449 (for the switch circuit 415-2). Although two switch circuits 415 are depicted in FIG. 4, in accordance with further example embodiments, the supply voltage switching circuit 310 may have three or more switch circuits 415 for three or more source supply voltages.

For example embodiments that are described herein, the switch circuits 415-1 and 415-2 share a common design 415, with similar components being denoted by similar reference numerals. The suffixes "1" and "2" are used herein when referring to a component of a specific switch circuit 415. For example, in the following description, reference numeral "432-1" refers to a current source 432 of the switch circuit 415-1, whereas reference numeral "432-2" refers to the current source 432 of the switch circuit 415-2.

During steady state operation, either the $V_1$ source supply voltage or the $V_2$ source supply voltage is coupled to the supply rail 449, and the other source supply voltage is isolated from the rail 449. In the following discussion, when a source supply switching change is pending, the source supply voltage to be coupled to the supply rail 449 is called the "$V_{NEW}$ source supply voltage," or "$V_{NEW}$" voltage and the other source supply voltage that is coupled to the supply rail 449 before switching occurs is referred to herein as the "$V_{OLD}$ source supply voltage," or "$V_{OLD}$" voltage.

In general, the supply voltage switching circuit 310 controls the coupling of the $V_{NEW}$ source supply voltage to the supply rail 449 and the decoupling of the $V_{OLD}$ source supply voltage from the supply rail 449, based on the magnitude relationship of the $V_{NEW}$ and $V_{OUT}$ voltages. In this manner, in accordance with example embodiments, a controller circuit 411 of the supply voltage switching circuit 310 controls the operation of the switch circuits 415 based at least in part on whether the $V_{NEW}$ source supply voltage is 1.) within a threshold voltage (called "$\Delta V$" herein) of the $V_{OUT}$ voltage; 2.) greater than the $\Delta V$ threshold voltage above the $V_{OUT}$ voltage; 3.) or less than the $\Delta V$ threshold voltage below the $V_{OUT}$ voltage.

In accordance with example embodiments, the controller 411 may include a processing core, such as the processing core 150. The controller circuit 411 may be formed from dedicated circuits, which do not execute machine executable instructions, in accordance with further example embodiments.

In accordance with example embodiments, for purposes of determining the relationship between the $V_{NEW}$ source supply voltage and the $V_{OUT}$ voltage, the supply voltage switching circuit 310 includes a voltage comparator 410. As depicted in FIG. 4, the comparator 410 compares the $V_{NEW}$ source supply voltage to the $V_{OUT}$ voltage and provides a pair of output signals (signals $V_{OP}$ and $V_{OM}$ of the comparator 410, for example) to the controller circuit 411, which represents a result of the comparison. As described above, for example, the result of the comparison may indicate that $V_{NEW}$ voltage is 1.) within a threshold voltage of the $V_{OUT}$ voltage; 2.) greater than the $\Delta V$ threshold voltage above the $V_{OUT}$ voltage; 3.) or less than the $\Delta V$ threshold voltage below the $V_{OUT}$ voltage.

As described further herein, the controller circuit 411 generates control signals for purposes of controlling operation of the switch circuits 415-1 and 415-2: a $V_{G1}$ gate voltage that is received by the switch circuit 415-1; a $V_{G2}$ gate that is received by the switch circuit 415-2; and signals 412, which control current sources of the switch circuits 415-1 and 415-2. As depicted in FIG. 4, in accordance with some embodiments, the controller circuit 411 may receive the $V_{MAX}$ maximum supply voltage to power the circuit 411; and the controller circuit 411 may receive feedback signals to control operation of the switch circuits 415, such as a $V_{P1}$ voltage and a $V_{P2}$ voltage, as further described herein.

The switch circuit 415 includes a switch, a P-channel metal-oxide-semiconductor field effect transistor (PMOSFET) 444, which has a source-to-drain current path coupled between the source supply voltage received by the switch circuit 415 (i.e., either the $V_1$ source supply voltage or the $V_2$ source supply voltage) and the supply rail 449. The gate of the PMOSFET 444 receives a control voltage, which regulates the switching operation of the PMOSFET 444. For the switch circuit 415-1, the control voltage is the $V_{G1}$ gate voltage, and for the switch circuit 415-2, the control voltage is the $V_{G2}$ gate voltage. As depicted in FIG. 4, the gate of the PMOSFET 444 is coupled to a node 445.

In general, when the supply voltage switching circuit 310 operates in the steady state mode operation, the controller circuit 411 1.) fully asserts the $V_{G1}$ or $V_{G2}$ gate voltage to fully turn on one of the PMOSFETs 444 to couple one source supply voltage to the supply rail 449; and 2.) fully deasserts the other gate voltage to fully turn off the other PMOSFET 444 to decouple, or isolate, the other source supply voltage from the supply rail 449.

The supply voltage switching circuit 310 includes a slew rate regulator, which is used by the controller circuit 411 to control the time rate at which the magnitude of the $V_{OUT}$ voltage changes (i.e., control the "slew rate" of the $V_{OUT}$ voltage) when the circuit 310 leaves its steady state mode of operation and switches the supply rail 449 from the $V_{OLD}$ source supply voltage to the $V_{NEW}$ source supply voltage. The slew rate regulator includes the following components of each switch circuit 415: a capacitor 440 (coupled between the node 445 and the supply rail 449); a current source 432 (coupled between the $V_{MAX}$ maximum supply voltage and the node 445 to furnish a relatively constant source current to the node 445 when enabled); and a current sink 436

(coupled between the node 445 and ground to sink a relatively constant current from the node 445, when enabled).

More specifically, in accordance with example embodiments, during the steady state mode of operation of the supply voltage switching circuit 310, the controller circuit 411 powers off, or disables, the current source 432 and the current sink 436 of each switch circuit 415. When switching from the $V_{OUT}$ voltage to the $V_{NEW}$ voltage, the controller circuit 411 uses the signals 412 to selectively turn on and off the current sources 432 and current sinks 436 of the switch circuits 415-1 and 415-2, based on the relationship of the $V_{NEW}$ and $V_{OUT}$ voltages, for purposes of regulating the slew rate of the $V_{OUT}$ voltage during the switching.

As described further herein, for purposes of turning off the PMOSFET 444 of a given switch circuit 415 (to decouple a source supply voltage from the supply voltage rail 449) and simultaneously regulate the slew rate of the $V_{OUT}$ voltage, the controller circuit 411 turns on, or enables, the current source 432 of the given switch circuit 415 to charge the node 445; and the current sink 436 of the given switch circuit 415 is disabled, or turned off (i.e., its state remains the same as in the steady state mode of operation). The charging of the node 445 causes the voltage of the node 445 to increase and thus, causes the PMOSFET 444 to transition from being fully turned on to being fully turned off. The time rate (or slew rate) at which the voltage of the node 449 changes is a function of the current that the current source 432 provides ($I_1$) and the capacitance (C) of the capacitor 440: slew rate=$I_1$/C.

For purposes of turning on the PMOSFET 444 of a given switch circuit 415 (to couple a source supply voltage to the supply voltage rail 449) and simultaneously regulate the slew rate of the $V_{OUT}$ voltage, the controller circuit 411 turns on, or enables, the current sink 436 of the given switch circuit 415 to discharge the node 445; and the current source 432 of the given switch circuit is disabled, or turned off (i.e., its state remains the same as in the steady state mode of operation). The discharging of the node 445 causes the voltage of the node 445 to decrease and thus, causes the PMOSFET 444 to transition from being fully turned off to being fully turned on. The time rate (or slew rate) at which the voltage of the node 449 changes is a function of the current of the current sink 436 ($I_2$) and the capacitance C of the capacitor 440: slew rate=$I_2$/C.

When being turned on, the PMOSFET 444 may initially be unable to support the load (represented by current source 448) that is coupled to the supply voltage switching circuit 310. In accordance with example embodiments, for purposes of providing a comparison signal to the controller circuit 411 to indicate whether the PMOSFET 444 is sufficiently turned on to support the load, the switch circuit 415 includes a current comparator 423. More specifically, in accordance with example embodiments, the current comparator 423 provides a voltage (the $V_{P1}$ voltage for the switch circuit 415-1 and the $V_{P2}$ voltage for the switch circuit 415-2), which, as described further herein, binarily indicates the load supporting status of the PMOSFET 444 that is being turned on.

As depicted in FIG. 4, in accordance with example embodiments, the current comparator 423 includes a PMOSFET 424, whose source is coupled to the source supply voltage associated with the switch circuit 415. The gate of the PMOSFET 424 is coupled to the node 445, and the drain of the PMOSFET 424 provides $V_{P1}/V_{P2}$ voltage to the controller circuit 411. A current sink 428 is coupled between the drain of the PMOSFET 424 and ground; and the current sink 428 is oriented to conduct current through the source-to-drain current path of the PMOSFET 424, as depicted in FIG. 4. The operation of the current comparator 423 is described further below.

Figure 5A:
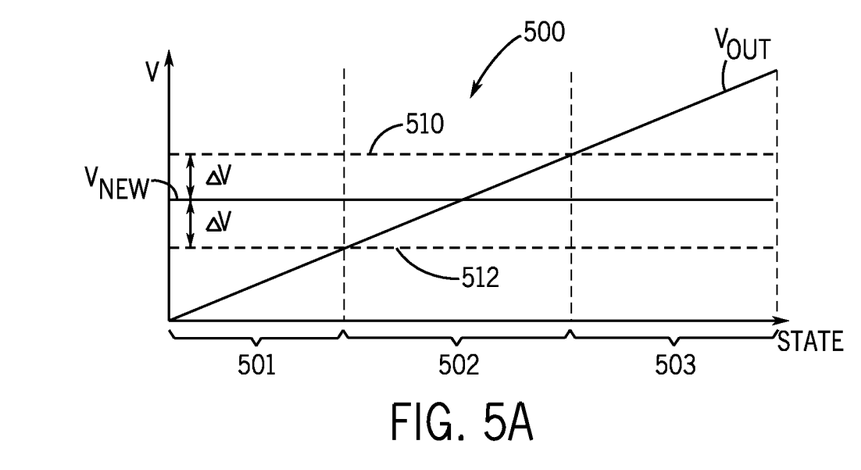
FIG. 5A depicts switching states of the supply voltage switching circuit of FIG. 4 according to an example embodiment.

FIG. 5A is an illustration 500 of the different states of the supply voltage switching circuit 310 as a function of the $V_{OUT}$ and $V_{NEW}$ voltages. In this manner, referring to FIG. 5A in conjunction with FIG. 4, in accordance with some embodiments, for purposes of preparing for a source supply voltage switching transition, the controller circuit 411 considers the relationship of the $V_{OUT}$ voltage to the $V_{NEW}$ voltage. Based on this relationship, the controller circuit 411 determines if and how slew rate-controlled switching should be employed.

More specifically, in accordance with example embodiments, FIG. 5A depicts three potential states for the supply voltage switching circuit 310 based on the relationship of the $V_{OUT}$ and $V_{NEW}$ voltages: a first state 501 in which the $V_{OUT}$ voltage is far enough below the $V_{NEW}$ voltage to employ slew rate-controlled switching to switch over to the $V_{NEW}$ voltage; a second state 502, in which the $V_{OUT}$ and $V_{NEW}$ voltages are close enough to not employ slew rate-controlled switching; and a third state 503 in which the $V_{OUT}$ voltage is far enough above the $V_{NEW}$ voltage to employ slew rate-controlled switching to switch over to the $V_{NEW}$ voltage. Although, in general, slew rate-controlled switching is not necessary when switching between supply voltages which are very close in magnitude, other example embodiments may set $\Delta V$ equal to 0, effectively eliminating state 502 and causing all supply transitions to employ slew rate control.

In accordance with example embodiments, for purposes of determining whether the $V_{OUT}$ and $V_{NEW}$ voltages are far enough apart to use slew rate-controlled switching, the controller circuit 411 establishes a threshold band about the $V_{NEW}$ voltage. The threshold band is defined by an upper threshold voltage 510 (spaced a $\Delta V$ threshold voltage above the $V_{NEW}$ source supply voltage) and a lower threshold voltage 512 (spaced a $\Delta V$ threshold voltage below the $V_{NEW}$ source supply voltage); and the controller circuit 411 compares the $V_{OUT}$ voltage to the threshold voltages 510 and 512 to determine whether the $V_{OUT}$ voltage is within the threshold band. In this manner, in accordance with example embodiments, the state 501 occurs when the $V_{OUT}$ voltage is less than the lower threshold voltage 512 (i.e., $V_{OUT}<V_{NEW}-\Delta$); the state 502 occurs when the $V_{OUT}$ voltage is below the upper threshold voltage 510 and above the lower threshold voltage 512 (i.e., $V_{NEW}-\Delta V \leq V_{OUT} \leq V_{NEW}+\Delta V$); and the state 503 occurs when the $V_{OUT}$ voltage is greater than the upper threshold voltage 510 (i.e., $V_{OUT}>V_{NEW}+\Delta V$).

Figure 5B:
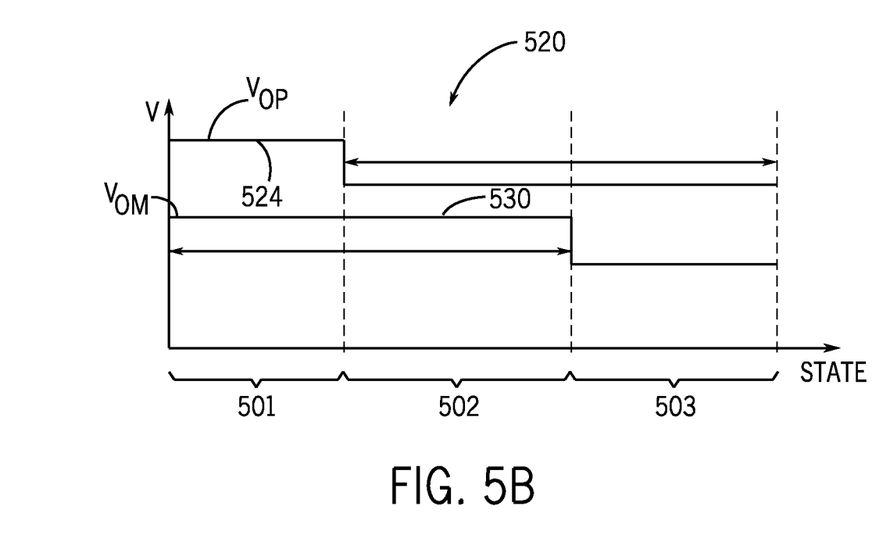
FIG. 5B depicts output voltages of a comparator of the supply voltage switching circuit of FIG. 4 for different switching states according to an example embodiment.

FIG. 5B is an illustration 520 depicting how the output signals that are provided by the comparator 410 (see FIG. 4) are used by the controller circuit 511 to identify the particular state 501, 502 or 503, in accordance with example embodiments. In this manner, referring to 5B in conjunction with FIGS. 5A and 4, when the $V_{OUT}$ voltage is below the lower threshold voltage 512, the comparator 410 asserts (drives high, for example) both the $V_{OP}$ voltage and the $V_{OM}$ voltage. For the state 502 in which the $V_{OUT}$ voltage is within the threshold band, the comparator 410 deasserts the $V_{OP}$ voltage and asserts the $V_{OM}$ voltage. When the $V_{OUT}$ voltage is above the upper threshold voltage 510, the comparator 410 deasserts both the $V_{OP}$ voltage and $V_{OM}$ voltages.

For the state 502, the controller circuit 411 fully asserts the $V_{G1}$ or $V_{G2}$ gate voltage and fully deasserts the other gate voltage, without regulating the slew rate of the $V_{OUT}$ voltage during the transition. Operations of the controller circuit 411 for the state 501 in which the $V_{OUT}$ voltage is below the lower threshold voltage 512 and the state 503 in which the $V_{OUT}$ voltage is above the upper threshold voltage 510 are discussed below.

Figure 6A:
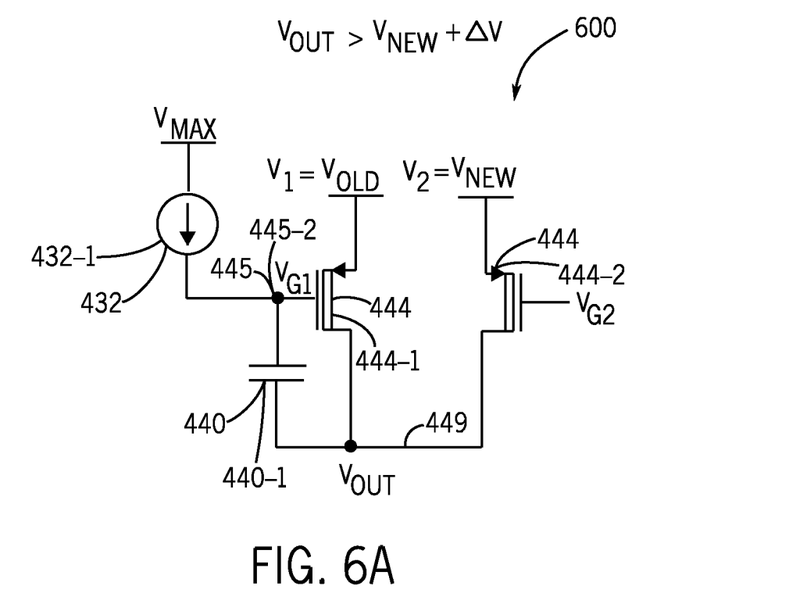
FIG. 6A is a schematic diagram of part of the supply voltage switching circuit of FIG. 4 depicting operation of the switching circuit when switching from a first source supply voltage to a lower second source supply voltage according to an example embodiment.

FIG. 6A is an illustration 600 of the switching operation of the supply voltage switching circuit 310 for the switching state 503 (see FIG. 5A), the state when the $V_{OUT}$ voltage is initially greater than the upper threshold voltage 510 (i.e., for $V_{OUT} > V_{NEW} + \Delta V$). For this example, the $V_1$ source supply voltage is the $V_{OLD}$ voltage, and the $V_2$ source supply voltage is the $V_{NEW}$ voltage. Voltage waveforms that are associated with the state 503 are depicted in FIG. 6B.

Figure 6B:
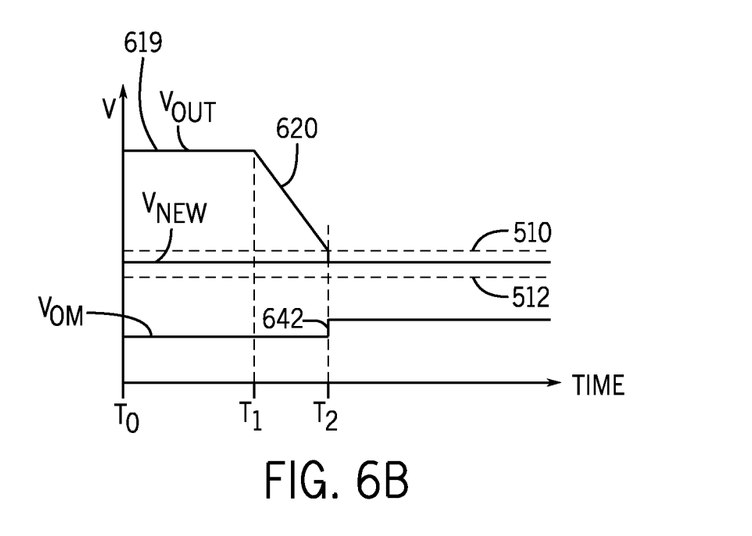
FIG. 6B depicts voltage waveforms of FIG. 6A according to an example embodiment.

Referring to FIG. 6A in conjunction with FIGS. 6B and 4, the switching control begins at time $T_0$ when the $V_{OUT}$ voltage is constant, as depicted at reference numeral 619; and the controller circuit 411 evaluates the relationship between the $V_{OUT}$ and the $V_{NEW}$ voltages to identify the state 503. At time $T_1$, the controller 411 enables, or turns on, the current source 432-1 for purposes of controlling the slew rate at which the PMOSFET 444-1 (which is initially turned on) turns off. In this manner, from time $T_1$ to time $T_2$, the $V_{OUT}$ voltage linearly decreases (as depicted at reference numeral 620) at a time rate that is determined by the current of the current source 432-1 and the capacitance of the capacitor 440-1. Although FIG. 6B depicts the linear ramp starting at time $T_1$, it may in fact start sometime after time $T_1$ depending on the functional parameters of PMOSFET 444-1.

At time $T_2$, the $V_{OUT}$ voltage reaches the upper threshold 510 of the threshold band. As also depicted in FIG. 6B, the output signals provided by the comparator 410 (FIG. 4) change (as indicated at reference numeral 642) at or near time $T_2$ to indicate that the $V_{OUT}$ voltage is within the $\Delta V$ threshold of the $V_{NEW}$ voltage. Upon detection of this occurrence, the controller circuit 411 disables, or turns off, the current source 432-1; fully asserts the $V_{G1}$ gate voltage to turn off the PMOSFET 444-1 to fully decouple the $V_1$ source supply voltage from the supply rail 449; and fully deasserts the $V_{G2}$ gate voltage to fully turn on the PMOSFET 444-2 to couple the $V_2$ source supply voltage to the supply rail 449. Also, at time $T_2$, the controller circuit 411, in accordance with example embodiments, disables, or turns off, the comparator 410.

Figure 7A:
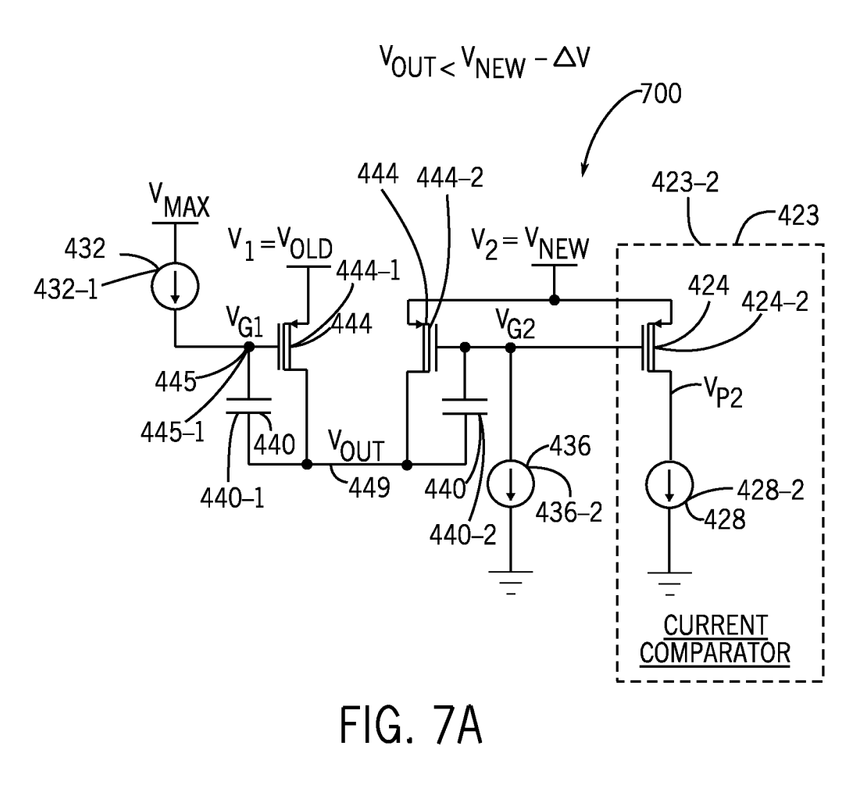
FIG. 7A is a schematic diagram of part of the supply voltage switching circuit of FIG. 4 depicting operation of the switching circuit when switching from a first source supply voltage to a greater second source supply voltage according to an example embodiment.

FIG. 7A is an illustration 700 of the switching operation of the supply voltage switching circuit for the switching state 501 (see FIG. 5A), the state when the $V_{OUT}$ voltage is initially below the lower threshold voltage 512. For this example, the $V_1$ source supply voltage is the $V_{OLD}$ voltage, and the $V_2$ source supply voltage is the $V_{NEW}$ voltage. Voltage waveforms that are associated with the switching state 501 are depicted in FIG. 7B.

For the switching state 501, the controller circuit 411 controls the slew rate of the decoupling of the $V_{OLD}$ voltage from the supply rail 449 while controller circuit 411 also controls the slew rate of the coupling of the $V_{NEW}$ source supply voltage to the supply rail 449.

Figure 7B:
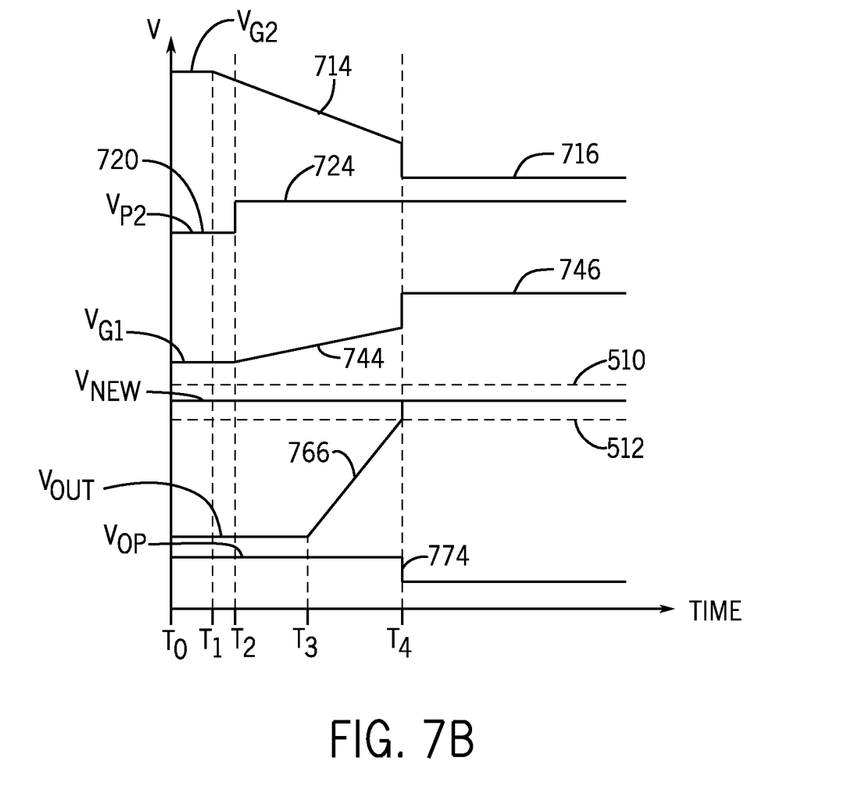
FIG. 7B illustrates voltage waveforms of FIG. 7A according to an example embodiment.

Referring to FIG. 7B in conjunction with FIGS. 7A, and 4, at time $T_0$, the controller circuit 411 assesses the particular state that controls the switching and identifies the state 501. At time $T_1$, the controller circuit 411 turns on, or enables, the current sink 436-2 for purposes of controlling the slew rate at which the $V_{NEW}$ voltage is coupled to the supply rail 449.

Therefore, as depicted beginning at time $T_1$, the $V_{G2}$ gate voltage linearly decreases, as depicted at reference numeral 714.

Between times $T_1$ and $T_2$, when the $V_{G2}$ voltage has a relatively large magnitude, the PMOSFET 444-2 is slightly turned on and may not support the load that is coupled to the supply rail 449. The controller circuit 411 determines when the PMOSFET 444-2 can support the maximum expected load using the current comparator 423-2. In this manner, in accordance with example embodiments, the maximum expected load current is established by the current of the current sink 428-2 multiplied by the ratio of the size of PMOSFET 444-2 relative to PMOSFET 424-2. When the PMOSFET 444-2 is capable of supporting the maximum expected load on the supply rail 449, the drain voltage of the PMOSFET 424-2, i.e., the $V_{P2}$ voltage, is asserted, or driven high, as illustrated by the transition of the $V_{P2}$ voltage from a logic zero level 720 to a logic one level 724 at time $T_2$ in FIG. 7B. The controller circuit 411 responds to the assertion of the $V_{P2}$ voltage by turning on the current source 432-1 to control the slew rate of the decoupling of the $V_{OLD}$ voltage from the supply rail 449. As also shown at reference numeral 714 in FIG. 7B, the $V_{G2}$ gate voltage continues to decline after time $T_2$ at a linear rate controlled by the capacitance of the capacitor 440-2 and the current of the current sink 436-2.

When the controller circuit 411 turns on the current source 432-1 at time $T_2$, the $V_{G1}$ gate voltage ramps upwardly at a linear rate, as indicated at reference numeral 744.

At time $T_3$, the $V_{OUT}$ voltage begins to linearly rise, as depicted at reference numeral 766. This rise in $V_{OUT}$ corresponds to the point at which PMOSFET 444-1 can no longer sustain the difference between the current flowing through PMOSFET 444-2 and the load current. At time $T_4$, the $V_{OUT}$ voltage reaches the lower threshold voltage 512, and this occurrence is detected by the comparator 410, as indicated by the deassertion of its output signal $V_{OP}$ at reference numeral 774. This deassertion of the $V_{OP}$ signal, in turn, causes the controller circuit 411 to enter the steady state operation in which the circuit 411 1.) drives the $V_{G1}$ gate voltage to a high level, as indicated at reference numeral 746, to fully turn off the PMOSFET 444-1; and 2.) concurrently drives the $V_{G2}$ gate voltage to a low level, as depicted at reference numeral 716, to fully turn on the PMOSFET 444-2. Also, at time $T_4$, the controller circuit 411 in accordance with example embodiments, turns off the current sources 432-1 and 428-2, and current sink 436-2.

Figure 8:
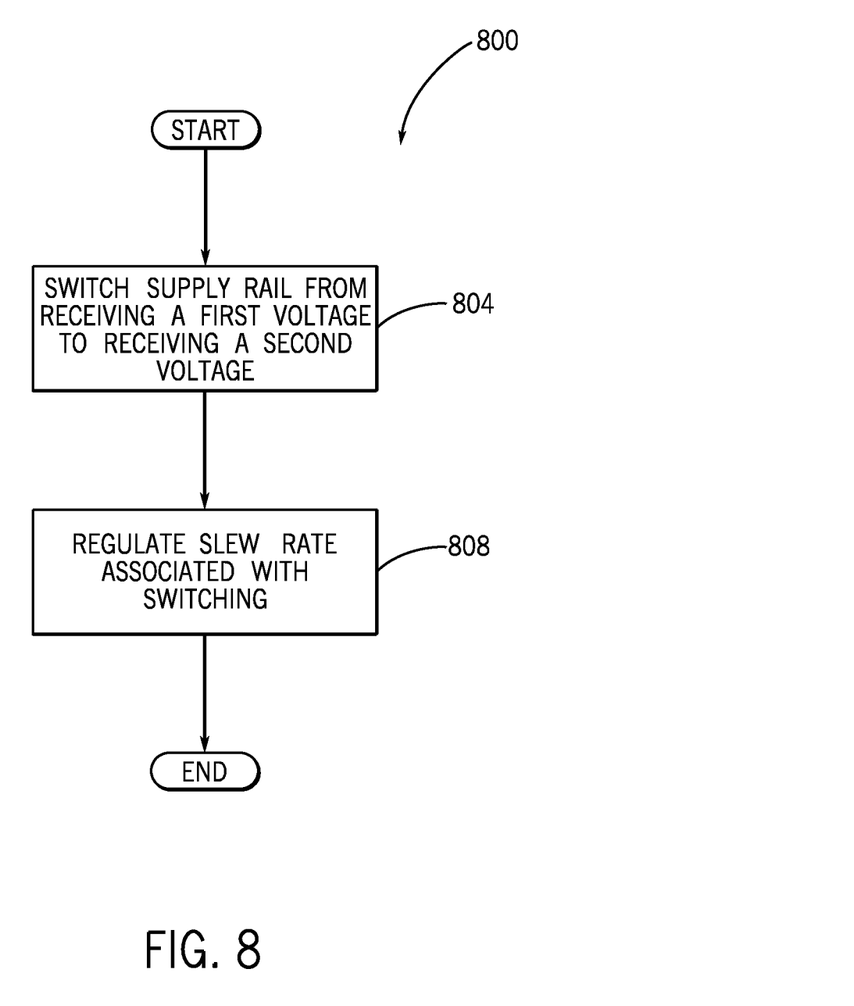
FIGS. 8 and 9 are flow diagrams depicting techniques to perform slew rate-controlled power supply voltage switching according to example embodiments.

Thus, referring to FIG. 8, in accordance with example embodiments, a technique 800 to regulate the switching of source supply voltages includes switching (block 804) a supply rail from receiving a first voltage to receiving a second voltage and regulating (block 808) a slew rate that is associated with the switching.

Figure 9:
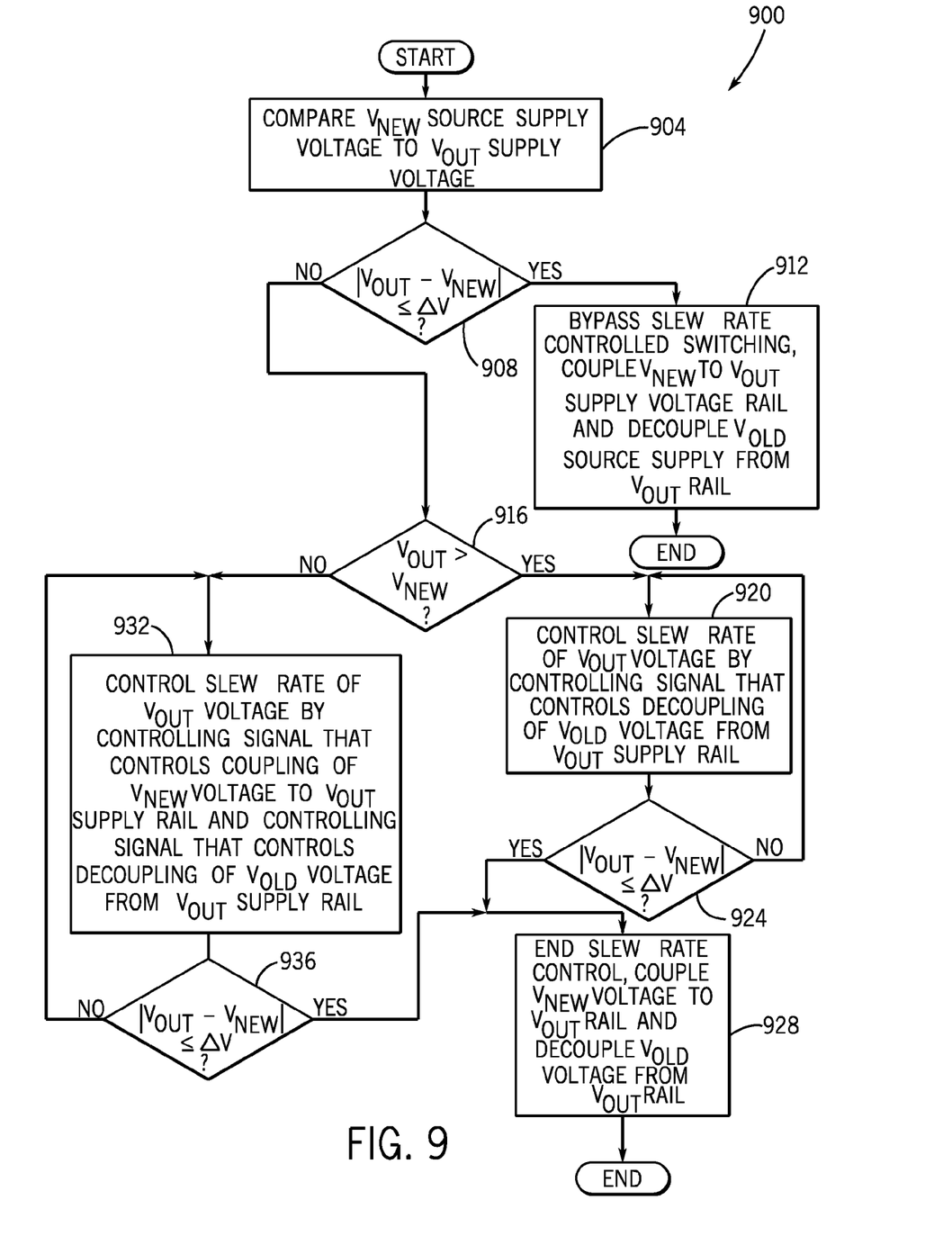

More specifically, referring to FIG. 9, in accordance with example embodiments, a technique 900 to regulate switching of source supply voltages includes comparing (block 904) a $V_{NEW}$ source supply voltage to a $V_{OUT}$ supply voltage to determine (diamond 908) whether the absolute difference of the voltages is less than or equal to a $\Delta V$ threshold voltage. If so, the technique 900 includes bypassing slew rate controlled switching and coupling the $V_{NEW}$ source supply voltage to the $V_{OUT}$ supply voltage and decoupling the $V_{OLD}$ source supply voltage from the $V_{OUT}$ supply rail, pursuant to block 912.

If the absolute difference between the $V_{OUT}$ supply voltage and the $V_{NEW}$ voltage is greater than the $\Delta V$ threshold voltage (as determined in diamond 908), then the technique 900 includes determining (diamond 916) whether the $V_{OUT}$ supply voltage is greater than the $V_{NEW}$ voltage. If so, the technique 900 includes controlling (block 920) the slew rate of node 449, the supply rail, by controlling the signal that controls the decoupling of the $V_{OUT}$ voltage from the $V_{OUT}$ supply rail. This control includes monitoring (pursuant to diamond 924) whether the $V_{OUT}$ supply voltage is within the $\Delta V$ threshold of the $V_{NEW}$ voltage. In this regard, the technique 900 includes responding to the $V_{NEW}$ voltage being within the $\Delta V$ threshold voltage of the $V_{OUT}$ supply voltage, by ending the slew rate control, i.e., coupling the $V_{NEW}$ voltage to the $V_{OUT}$ supply rail and decoupling the $V_{OLD}$ voltage from the $V_{OUT}$ supply voltage rail, pursuant to block 928.

If, in diamond 916, a determination is made that the $V_{OUT}$ supply voltage is less than the $V_{NEW}$ voltage, then the signal controlling the coupling of the $V_{NEW}$ voltage to the $V_{OUT}$ supply rail and the signal controlling the decoupling of the $V_{OLD}$ voltage from the $V_{OUT}$ supply rail are controlled in order to control the slew rate of the $V_{OUT}$ supply rail, pursuant to block 932. This slew rate control continues until a determination is made (diamond 936) that the $V_{OUT}$ supply voltage is within the $\Delta V$ threshold voltage of the $V_{NEW}$ voltage; and when this occurs, the technique 900 transitions to block 928.

Figure 10:
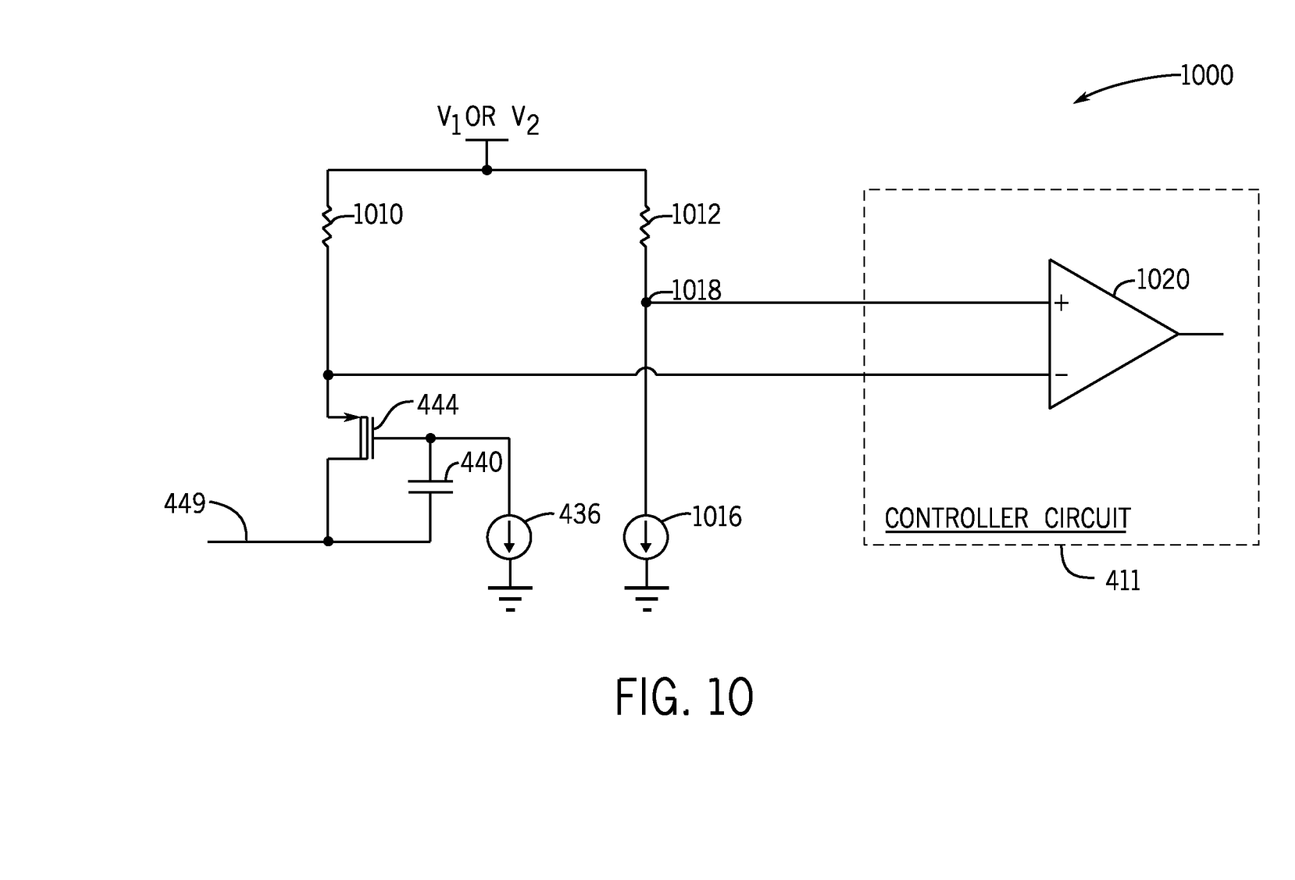
FIG. 10 is a schematic diagram of a comparator circuit for the supply voltage switching circuit of FIG. 4 according to a further example embodiment.

Other embodiments are contemplated, which are within the scope of the appended claims. For example, in accordance with further embodiments, a comparator 1000 that is depicted in FIG. 10 may be used in place of the current comparator 423 (see FIG. 4) for purposes of signaling the controller circuit 411 when the PMOSFET 444 can support the load. Referring to FIG. 10, the comparator 1000 includes a pullup resister 1010 that is coupled between the source of the PMOSFET 444 and the $V_1$ or $V_2$ source supply voltage (depending on whether the comparator 423 is part of the circuit 415-1 or 415-2). The comparator circuit 1000 also includes a current sink 1016 that is coupled between a node 1018 and ground, and the comparator circuit 1000 includes a resistor 1012 that is coupled between the node 1018 and the source supply voltage. The source of the PMOSFET 444 and the node 1018 form respective comparison voltages, which are compared by a comparator 1020 for purposes of providing a signal to the controller circuit 411 representing whether the PMOSFET 444 can support the load.

As depicted in FIG. 10, in accordance with example embodiments, the node 1018 is connected to the noninverting input of the comparator 1020, and the source of the PMOSFET 444 is coupled to the inverting input of the comparator 1020. In operation, when the PMOSFET 444 is unable to support the maximum expected load that is coupled to the supply rail 449, the source voltage of the PMOSFET 444 is pulled high enough to cause the comparator 1020 to deassert its output. When the PMOSFET 444 is sufficiently turned on and can support the maximum expected load, the source-to-drain current path of the PMOSFET 444 pulls the source voltage low to cause the comparator 1020 to assert its output.

While the present techniques have been described with respect to a number of embodiments, it will be appreciated that numerous modifications and variations may be applicable therefrom. It is intended that the appended claims cover all such modifications and variations as fall within the scope of the present techniques.

What is claimed is:

1. A method comprising:
switching a supply rail from receiving a first voltage to receiving a second voltage; and
regulating a slew rate associated with the switching, wherein regulating the slew rate comprises:
comparing the second voltage to a voltage of the supply rail; and
controlling the switching based at least in part on a result of the comparison.

2. The method of claim 1, wherein regulating the slew rate further comprises regulating a voltage of the supply rail during at least part of a time interval in which the switching is performed.

3. The method of claim 1, wherein the result of the comparison indicates that the voltage of the supply rail is greater than the summation of the second voltage and a predetermined threshold, and controlling the switching comprises:
regulating a time rate at which the voltage of the supply rail decays from the first voltage to the second voltage.

4. The method of claim 3, wherein regulating the time rate at which the voltage of the supply rail decays comprises:
in response to the voltage of the supply rail being greater than the summation of the second voltage and the predetermined threshold, controlling a rate at which a switch that couples the first voltage to the supply rail is deactivated.

5. The method of claim 1, wherein the result of the comparison indicates that the voltage of the supply rail is less than the second voltage less a predetermined threshold, and controlling the switching based at least in part on a result of the comparison comprises:
controlling a rate at which a switch that couples the second voltage to the supply rail is activated.

6. The method of claim 5, wherein controlling the switching based at least in part on a result of the comparison further comprises:
determining whether the switch is sufficiently activated to support a load coupled to the supply rail, and selectively deactivating another switch that couples the first voltage to the supply rail based at least in part on the determination.

7. The method of claim 6, further comprising:
controlling a rate at which the another switch is deactivated.

8. The method of claim 1, wherein the result of the comparison indicates that the supply voltage is less than the second voltage less a predetermined threshold, and controlling the switching based at least in part on a result of the comparison comprises:
controlling a rate at which a switch that couples the first voltage to the supply rail is deactivated.

9. An apparatus comprising:
a slew rate regulation circuit;
a plurality of switches; and
a controller circuit to:
control the plurality of switches to decouple a first source supply voltage from a supply rail;
control the plurality of switches to couple a second source supply voltage to the supply rail to replace the first source supply voltage with the second source supply voltage; and
control the slew rate regulation circuit to regulate a slew rate of a voltage of the supply rail during a time interval in which the first source supply voltage is being replaced with the second source supply voltage, wherein controlling the slew rate regulation circuit comprises comparing the second source supply voltage to a voltage of the supply rail and controlling the plurality of switches based at least in part on a result of the comparison.

10. The apparatus of claim 9, wherein:
a first switch of the plurality of switches comprises a control terminal; and
the slew rate regulation circuit to control a signal provided to the control terminal to regulate the slew rate of the voltage of the supply rail.

11. The apparatus of claim 10, wherein:
the slew rate regulation circuit comprises a capacitor, and a current source or current sink; and
the controller to selectively turn on the current source or current sink to control a current in the capacitor to control the signal provided to the control terminal.

12. The apparatus of claim 9, wherein the slew rate regulation circuit to control a rate at which a given switch of the plurality of switches couples the second source supply voltage to the supply rail.

13. The apparatus of claim 9, wherein the slew rate regulation circuit to control a rate at which a given switch of the plurality of switches decouples the first source supply voltage from the supply rail.

14. An apparatus comprising an integrated circuit (IC) comprising a power consuming component, a supply rail coupled to the power consuming component to provide a supply voltage, and a switch control circuit, wherein the switch control circuit comprises:
a plurality of switches;
a voltage comparator to compare the second supply voltage to the supply voltage provided by the supply rail;
a slew rate regulator; and
a controller circuit to:
control the plurality of switches and the slew rate regulator to transition the supply rail from receiving a first supply voltage to receiving a second supply voltage and regulate a slew rate of the supply voltage during the transition; and
control the plurality of switches based at least in part on a result of the comparison by the comparator.

15. The apparatus of claim 14, wherein the result of the comparison indicates that the voltage of the supply rail is greater than the summation of the second supply voltage and a predetermined threshold, and the controller circuit to use the slew rate regulator to control the switches to regulate a time rate at which the voltage of the supply rail decays from the first supply voltage to the second supply voltage.

16. The apparatus of claim 15, wherein the plurality of switches comprises a first switch that couples the first supply voltage to the supply rail, and the controller circuit to use the slew rate regulator to control a rate at which the first switch is deactivated to regulate the time rate at which the voltage of the supply rail decays from the first supply voltage to the second supply voltage.

17. The apparatus of claim 14, wherein the result of the comparison performed by the comparator indicates that the voltage of the supply rail is less than the second supply voltage less a predetermined threshold, the plurality of switches comprises a first switch to couple the second supply voltage to the supply rail, and the controller circuit to use the slew rate regulator to control a rate at which the first switch is activated to regulate a time rate at which the voltage of the supply rail increases from the first supply voltage to the second supply voltage.

18. The apparatus of claim 17, wherein the plurality of switches comprises a second switch to couple the supply rail to the first supply voltage, and the controller circuit to use the slew rate regulator to control a rate at which the second switch is deactivated.

* * * * *